United States Patent [19]

Shinoda et al.

[11] 4,411,235
[45] Oct. 25, 1983

[54] FUEL INJECTION SYSTEM FOR INTERNAL COMBUSTION ENGINE

[75] Inventors: Kazuo Shinoda; Nobuyuki Kobayashi, both of Toyota; Toshiaki Isobe, Nagoya, all of Japan

[73] Assignee: Toyota Jidosha Kogyo Kabushiki Kaisha, Toyota, Japan

[21] Appl. No.: 337,716

[22] Filed: Jan. 7, 1982

[30] Foreign Application Priority Data

Jul. 24, 1981 [JP] Japan .................................. 56-115272

[51] Int. Cl.³ ........................... G01F 1/68; F02D 5/00
[52] U.S. Cl. .................................... 123/488; 123/463; 123/478; 123/494; 73/118
[58] Field of Search ............... 123/463, 488, 478, 494; 73/118 A, 861.01, 861.02, 861.03, 861.04, 861.05, 861, 204

[56] References Cited

U.S. PATENT DOCUMENTS

| | | | |
|---|---|---|---|
| 3,991,727 | 11/1976 | Kawai et al. | 123/478 |
| 4,051,818 | 10/1977 | Völckers | 123/494 |
| 4,075,983 | 2/1978 | Robinson | 123/478 |
| 4,238,956 | 12/1980 | Sniezck et al. | 73/861.01 |
| 4,300,399 | 11/1981 | Kuijpers et al. | 73/861.04 |
| 4,311,042 | 1/1982 | Hosoyn et al. | 123/478 |
| 4,334,426 | 6/1982 | Kita et al. | 73/118 A |

Primary Examiner—Raymond A. Nelli
Attorney, Agent, or Firm—Cushman, Darby & Cushman

[57] ABSTRACT

In an internal combustion engine having an amount of fuel injection controlled in relation to pressure in an intake pipe, a low pass filter is connected to the output side of an intake pipe pressure sensor so as to remove a pulsating component of the intake pressure. A second low pass filter is provided so as to compensate for the delay in response of such filter, and the outputs of both filters are calculated by a calculating unit.

16 Claims, 9 Drawing Figures

FUEL INJECTION SYSTEM FOR INTERNAL COMBUSTION ENGINE

BACKGROUND OF THE INVENTION

This invention relates to a fuel injection system for internal combustion engines having an amount of fuel injection to the engine controlled in relation to pressure in an intake pipe and more particularly to an system for measuring precisely the pressure in the intake pipe of the engine to control accurately the amount of fuel injection.

The pressure in the intake pipe of the internal combustion engine consists of average pressure determined by flow resistance and intake air flow according to a throttle valve and a pulsating component of intake pressure produced at every intake stroke of the engine and overlaid on the average pressure. In said type of fuel injection system, a pressure sensor for converting the intake pressure necessary for calculating the amount of fuel injection to electric signals is provided in the intake pipe. To remove the pulsating component of the intake pressure for measuring accurately the average pressure, either a throttle is provided between the intake pipe and the pressure sensor, or a low pass filter is provided between the sensor and an injection time calculating unit.

Though the pulsating component of the intake pressure can be removed by such throttle or low pass filter, a large delay in response to draft change in the average pressure takes place in acceleration or deceleration of the engine. This delay in the response of the average pressure in the acceleration or deceleration produces errors in the amount of fuel injection under such transitory running condition, resulting in the degradation of accelerating ability of the engine and the increase of noxious components of exhaust gas in the acceleration or deceleration.

SUMMARY OF THE INVENTION

An object of the present invention is to improve the response of the amount of fuel injection and thereby the output performance in the acceleration by compensating for the delay in the response of the low pass filter provided for removing the pulsating component of intake pressure. Another object of the present invention is to control accurately the air fuel ratio in the acceleration and deceleration of the engine for reducing noxious components of exhaust gas of the engine.

In the fuel injection system for internal combustion engines having the amount of fuel injection controlled in relation to the pressure in the intake pipe, a pressure sensor signal processing unit provided between a pressure sensor for measuring the pressure in the input pipe and an fuel injection amount calculating unit for calculating fuel injection time comprises two low pass filters connected in series to each other, the output signal of the first low pass filter of these low pass filters and that of the second one are added to a subtraction circuit, the output signal of this subtraction circuit and that of the first low pass filter are added to an addition circuit and the output signal of this addition circuit is added to the injection time calculating unit.

Further, according to the present invention, two low pass filters are connected in parallel to the output terminal of the pressure sensor for measuring the pressure in the intake pipe, the output signals of these low pass filters are added to the subtraction circuit, the output signal of this subtraction circuit and that of the first low pass filter are added to the addition circuit and the output signal of this addition circuit is added to the injection time calculating unit.

Furthermore, according to the present invention, two low pass filters are connected in series to the output terminal of the pressure sensor, the output signals of these low pass filters are added respectively to two input terminals of a calculating circuit comprising an operational amplifier having input resistance and feedback resistance and the output signal of this calculating circuit is added to the injection time calculating unit.

DESCRIPTION OF THE PREFERRED EMBODIMENTS

Figure 1:
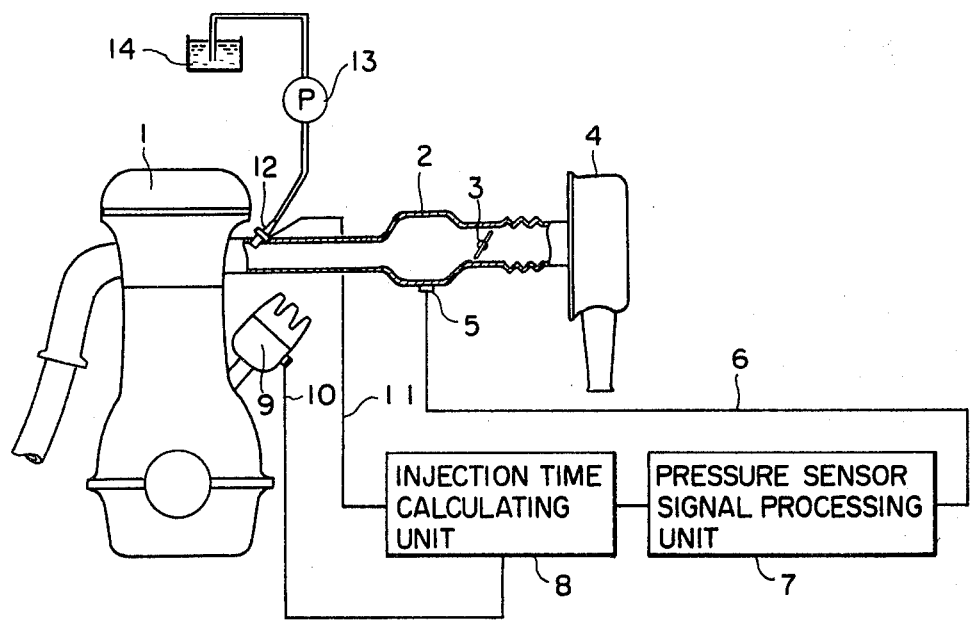
FIG. 1 is a schematic constitutional view of the whole fuel injection system for internal combustion engines.

In FIG. 1, 1 designates a main body of an internal combustion engine. A throttle valve 3 is provided in an intake pipe 2 of the main body 1 and air is sucked into the intake pipe 2 through an air cleaner 4. A pressure sensor 5 for measuring pressure in the intake pipe 2 supplies the output signal to a pressure sensor signal processing unit 7 through a conductor 6. The output signal of this pressure sensor signal processing unit 7 is sent to an injection time calculating unit 8 which is of a well-known type and supplied with not only the output signal of the pressure sensor signal processing unit 7 but also other parameters of engine operation to drive an electromagnetic injector 12 opening to the intake pipe 2 through a conductor 11 in synchronizaton with ignition signal supplied from an ignition system 9 of the engine through a conductor 10. The injector 12 injects fuel supplied from a fuel tank 14 through a pump 13 into the intake pipe 2.

Figure 2:
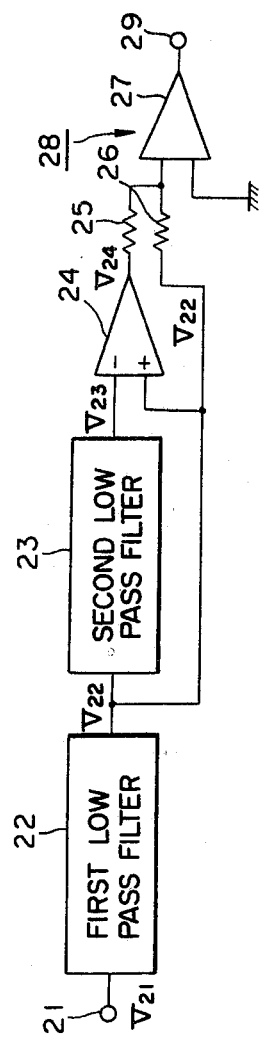
FIG. 2 is a circuit diagram of the pressure sensor signal processing unit according to this invention.

FIG. 2 shows details of the pressure sensor signal processing unit 7. Two low pass filters 22, 23 having same or different ranges of pass frequency respectively are connected in series to an input terminal 21 receiving the output signal of the pressure sensor. Various types of filters such as RC filter, LC filter, etc. may be used for these filters. The output end of the first low pass filter 22 is connected to the positive input terminal of a subtraction circuit 24 and the output terminal of the second low pass filter 23 connected to the negative input terminal of the subtraction circuit 24. An addition circuit 28 comprises two input resistances 25, 26 connected in parallel to each other for addition and an operational amplifier 27. The first input resistance 25 is connected to the output terminal of the subtraction circuit 24 and the second input resistance 26 connected to the output terminal of the first low pass filter 22. The output terminal 29 of the addition circuit 28 is also the input terminal of the injection time calculating unit.

Figure 3:
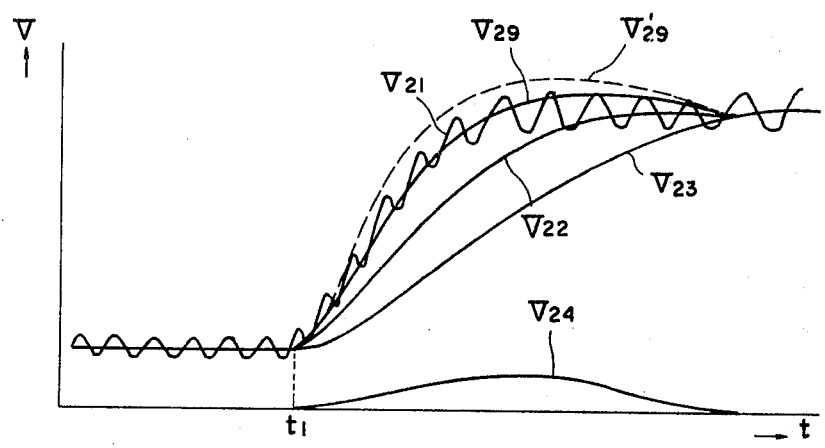
FIGS. 3 and 4 are diagrams for explaining the action of same unit.

The action of this pressure sensor signal processing unit will be described with reference to FIG. 3 showing a change with the passage of time in the output voltage signal of circuit in the pressure sensor signal processing unit shown in FIG. 2.

$V_{21}$ represents the output signal of the pressure sensor entering the input terminal 21. It will be understood that, when the throttle valve of the engine is quickly opened, the output $V_{21}$ signal of the pressure sensor is quickly raised. This signal contains a pulsating voltage component caused by the pulsation of intake pressure of the engine as mentioned above. When the signal containing such pulsating voltage component is sent to the injection time calculating unit as it is, the result of the calculation varies with the level of wave form of the pulsating voltage on the base of which the injection time is calculated, resulting in the instability of fuel supply to the engine.

$V_{22}$ represents a signal which has passed through the first low pass filter 22. As is apparent from this, the pulsating voltage component is removed from the signal $V_{21}$ and signal voltage proportional to the average pressure in the intake pipe can be obtained under the normal condition. However, the voltage signal corresponding to the rise of the pressure in the intake pipe has a considerable delay in the rise portion.

Since, in prior fuel injection systems, signals having such delay were used for the calculation of injection time as they were, they could not control accurately the air fuel ratio under the transitory condition such as acceleration or deceleration. According to the present invention a circuit for compensating for this delay is added. Namely, the output signal $V_{22}$ of the first low pass filter 22 is applied to the second low pass filter 23. The output signal $V_{23}$ of this low pass filter 23 further lags behind the signal $V_{21}$. In the subtraction circuit 28, the difference between the signal $V_{22}$ and signal $V_{23}$ is formed to produce the signal $V_{24}$ at the output terminal. In the addition circuit 28 the signal $V_{22}$ is added to the signal $V_{24}$ so that the output signal $V_{29}$ is obtained at the output terminal 29 of this addition circuit 28, which output signal $V_{29}$ varies substantially with the average intake pressure without containing the pulsating voltage component and is sent to the injection time calculating unit.

Thus, the output signal $V_{21}$ of the pressure sensor has the pulsating voltage component removed and is processed into the average output signal $V_{29}$ without any delay in the response by passing through the signal processing unit shown in FIG. 2.

While it is assumed in the above description that values of the input resistances 25 and 26 for addition are equal, the output signal $V_{29}$, showing rise quicker than that of the input signal $V_{21}$ in the acceleration, may be obtained when the value of the resistance 25 in the addition circuit 28 is selected smaller than that of the resistance 26. This method effectively prevents injected fuel from adhering to cooled intake pipe wall or the like to increase the air fuel ratio in the acceleration.

Figure 4:
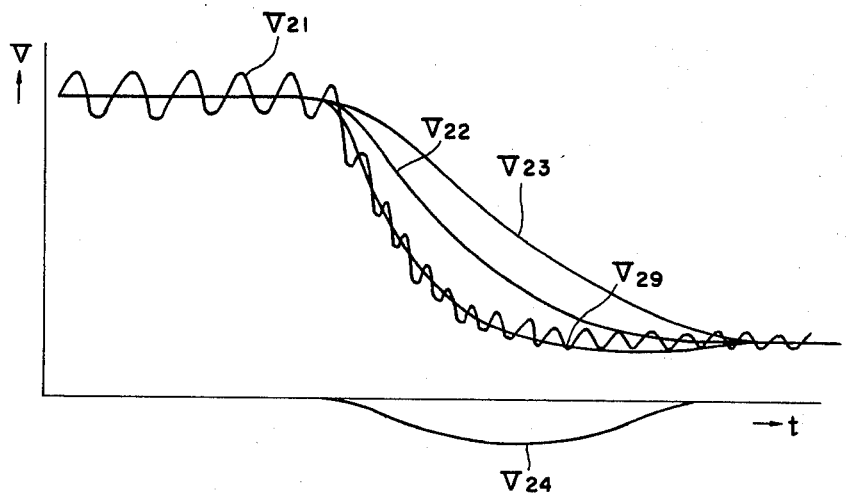

FIG. 4 shows the output signal of the circuit in the pressure sensor signal processing unit when the throttle valve of the engine is closed and thereby the pressure in the intake pipe is reduced. As is apparent from FIG. 4, precise signal wave form $V_{29}$ stripped of only the pulsating component of the intake pressure and having no delay in the response can be obtained similarly to that during the acceleration in FIG. 3, and noxious components in exhaust gas can be reduced.

Figure 5:
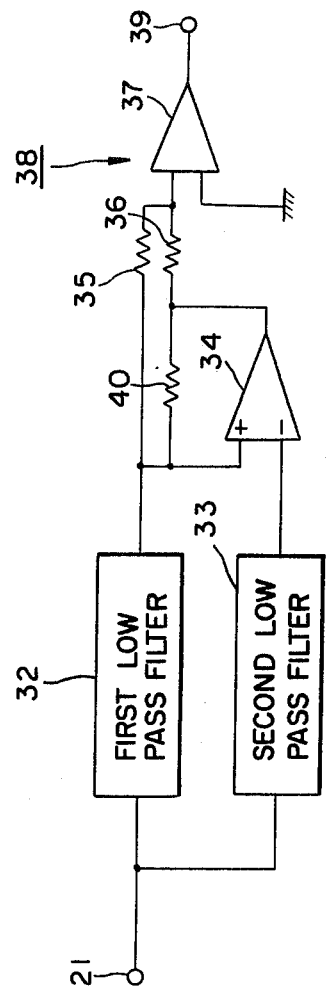
FIG. 5 is a circuit diagram of a further pressure sensor signal processing unit.

FIG. 5 shows a further embodiment of the pressure sensor signal processing unit. To the input terminal 21 of the pressure sensor signal processing unit are connected in parallel to first and second low pass filters 32,33. While the first low pass filter 32 has characteristics similar to those of the low pass filter 22 in FIG. 2, the second low pass filter 33 is selected to have a large delay corresponding to the signal curve $V_{23}$ in FIG. 3. The output terminals of these low pass filters 32, 33 are connected to the subtraction circuit 34, and the output terminals of this subtraction circuit 34 and the first filter 32 are connected respectively to the input resistances 35,36 of addition circuit 38 consisting of the input resistances 35,36 for addition and an operational amplifier 37. A matching resistance is designated by 40. The action of this unit is approximately same as that described with reference to FIG. 2 and further description is omitted.

Figure 6:
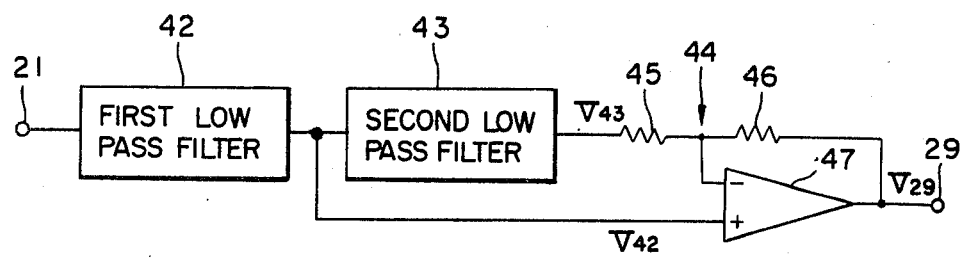
FIG. 6 is a circuit diagram of still further pressure sensor signal processing unit.
Figure 7:
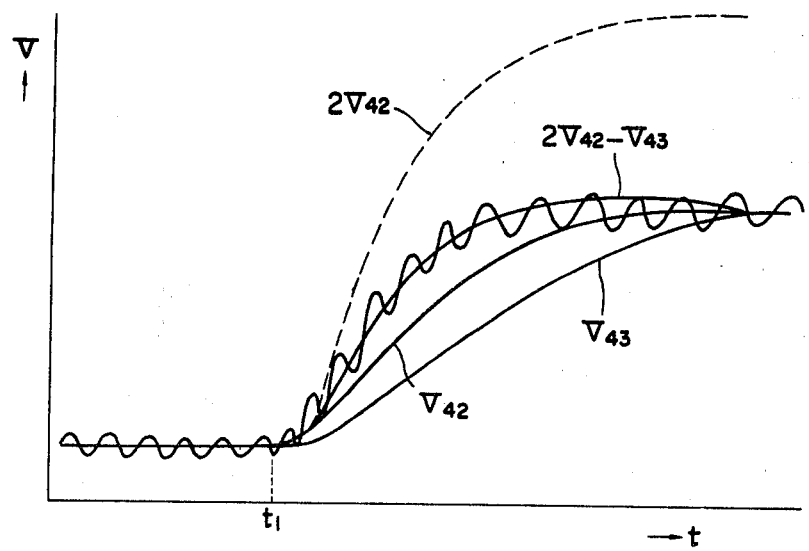
FIG. 7 is a diagram for explaining the action of said unit.

FIG. 6 shows a third embodiment of the pressure sensor signal processing unit. To the input terminal 21 receiving the output signal of the pressure sensor are connected in series same or different first and second low pass filters 42,43. The negative input terminal of a calculating circuit 44 consisting of an input resistance 45, feed-back resistance 46 and operational amplifier 47 is connected to the second low pass filter 43 through the input resistance 45, and the positive input terminal is connected to the first low pass filter 42. The signal can be processed similarly to that of the abovementioned embodiment by selecting proper values of the resistance 45 and 46 in this calculating circuit 44. Assuming now that the resistances 45,46 have specific values equal to each other, among the output signal $V_{42}$ of the first low pass filter 42, the output signal $V_{42}$ of the second low pass filter 43 and the output signal $V_{29}$ of the calculating circuit 44 is obtained the following relationship;

$$V_{29} = 2\ V_{42} - V_{43}$$

Namely, signals corresponding to the change in the average intake pressure can be obtained by selecting proper values of resistance $R_{45}, R_{46}$. Of course, characteristics of both low pass filters 42,43, different values of the resistances 45,46 and the ratio thereof can be selected according to the curve of change in the average intake pressure.

Figure 8:
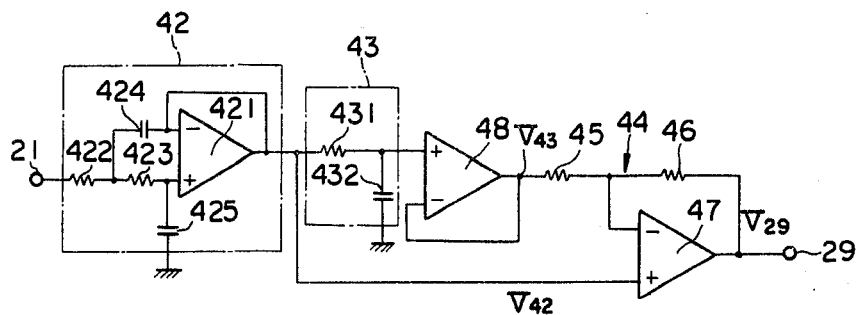
FIGS. 8 and 9 are respectively a circuit diagram of another pressure sensor signal processing unit and a diagram for explaining the action of same unit.
Figure 9:
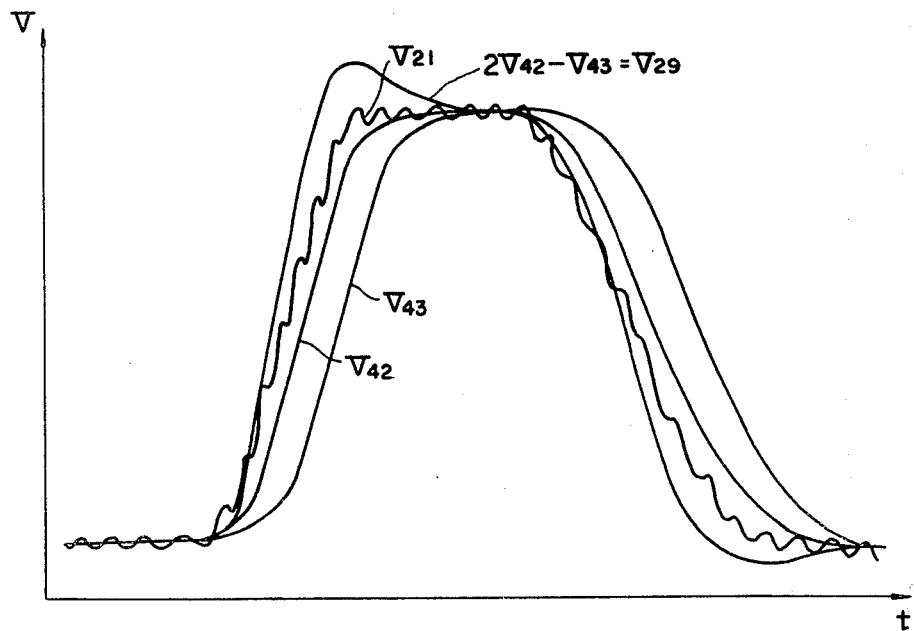

FIG. 8 shows a concrete constitution of the circuit shown in FIG. 6. The first low pass filter 42 is a secondary active filter having sharp breaking characteristics, comprising an operational amplifier 421 having the negative input terminal and output terminal shorted, two input resistances 422,423 connected in series to said amplifier, a capacitor 424 connected between the connection of these resistances 422,423 and the negative input terminal of the amplifier and a capacitor 425 having one pole connected to the positive input terminal and the other pole earthed. Also, the second low pass filter 43 is a L-shaped primary filter consisting of a resistance 431 and a capacitor 432. Further, a buffer amplifier 48 is connected between the filter 43 and the calculating circuit 44. In this case, by selecting proper time constant determined by the values of the resistance 431 of the second low pass filter 43 and the capacitor 432 and proper ratio between the resistances 45, 46 in the calculating circuit 44, the output signal $V_{29}$ having overshoot in the acceleration and undershoot in the deceleration is obtained as shown in FIG. 9. Thus, low density of mixture in the acceleration and high density in the deceleration are compensated for improving the operational performance of the engine and the purge of exhaust gas.

Thus, according to the present invention, not only the pulsating component of the pressure in the intake pipe is removed by the low pass filter, but also in the transitory condition such as the acceleration and deceleration the delay in the response caused by the low pass filter is compensated for by the additional circuit. Hence, signals which remove the pulsating voltage component of the pressure sensor output caused by the pulsation of the intake pressure and precisely respond to the change in the average pressure in the intake pipe are obtained so that the amount of fuel injected into the engine according to these signals can be precisely controlled. Consequently, the acceleration performance of internal combustion engines is improved and the air fuel ratio in the acceleration and deceleration can be accurately controlled so that noxious components of exhaust gas of the engine can be reduced and since the pressure sensor signal processing unit is constituted from electric circuits it is small-sized without needing any large space and does not wear. It provides advantageously desired characteristics simply be selecting proper constants in the electric circuits.

What is claimed is:

1. A fuel injection system for internal combustion engines having an amount of fuel injection controlled in relation to pressure measured in an intake pipe, characterized in that a pressure sensor signal processing unit connected between a pressure sensor for measuring the pressure in the intake pipe and a calculating unit for calculating fuel injection time comprises a first low pass filter, a second low pass filter connected in series to said first low pass filer, a subtraction circuit connected to the output terminal of the first low pass filter and the output terminal of the second low pass filter and an addition circuit connected to the output terminal of said subtraction circuit and the output terminal of the first low pass filter.

2. A fuel injection system for internal combustion engines as defined in claim 1, wherein the first and second low pass filters are RC filter and LC filter having same or different pass bands.

3. A fuel injection system for internal combustion engines as defined in claim 1, wherein the output terminal of the first low pass filter is connected to the positive output terminal of the subtraction circuit and the output terminal of the second low pass filter is connected to the negative input terminal of the subtraction circuit.

4. A fuel injection system for internal combustion engines as defined in claim 1, wherein the value of addition input resistance in the addition circuit connected to the output terminal of the subtraction circuit is equal to that of addition input resistance in the addition circuit connected to the output terminal of the second low pass filter.

5. A fuel injection system for internal combustion engines as defined in claim 1, wherein the value of addition input resistance in the addition circuit connected to the output terminal of the subtraction circuit is smaller than that of addition input resistance in the addition circuit connected to the output terminal of the second low pass filter.

6. A fuel injection system for internal combustion engines having an amount of fuel injection controlled in relation to pressure measured in a intake pipe, characterized in that a pressure sensor signal processing unit connected between a pressure sensor for measuring the pressure in the intake pipe and a calculating unit for calculating fuel injection time comprises a first low pass filter, a second low pass filter connected in parallel to said first low pass filter, a subtraction circuit having the input terminals respectively connected to the output terminals of the first and second low pass filters and an addition circuit connected to the output terminals of the subtraction circuit and the first low pass filter.

7. A fuel injection system for internal combustion engines as defined in claim 6, wherein the output terminal of the first low pass filter is connected to the positive input terminal of the subtraction circuit and the output terminal of the second low pass filter is connected to the negative input terminal of the subtraction circuit.

8. A fuel injection system for internal combustion engines as defined in claim 7, wherein the second low pass filter has the delay larger than that in the first low pass filter.

9. A fuel injection system for internal combustion engines having an amount of fuel injection controlled in relation to pressure measured in an intake pipe, characterized in that a pressure sensor signal processing unit connected between a pressure sensor for measuring the pressure in the intake pipe and a calculating unit for calculating fuel injection time comprises a first low pass filter, a second low pass filter connected in series to said first low pass filter and a calculating circuit consisting of input resistances, feed-back and resistances an operational amplifier, the output terminals of the first and second low pass filters being respectively connected to two input terminals of the operational amplifier.

10. A fuel injection system for internal combustion engines as defined in claim 9, wherein the input resistance and feed-back resistance in the calculating circuit have the same resistance value.

11. A fuel injection system for internal combustion engines as defined in claim 9 or 10, wherein the input resistance of the calculating circuit is in the negative input terminal of the operational amplifier.

12. A fuel injection system for internal combustion engines as defined in claim 9 or 10, wherein the first low pass filter is connected to the positive input terminal of the calculating circuit and the second low pass filter is connected to the negative input terminal of the calculating circuit.

13. A fuel injection system for internal combustion engines as defined in claim 9, wherein the first low pass filter is an active filter comprising an operational amplifier, a plurality of resistances and capacitors.

14. A fuel injection system for internal combustion engines as defined in claim 9, wherein the second low pass filter is a L-shaped filter comprising resistances and capacitors.

15. A fuel injection system for internal combustion engine as sefined in claim 9, wherein the time constants of the first and second low pass filters have values producing respectively over-shoot and under-shoot.

16. A fuel injection system for internal combustion engine as defined in claim 9, wherein a buffer amplifier is connected between the second filter and the calculating circuit.

* * * * *